(12) United States Patent
Igel et al.

(10) Patent No.: US 6,191,489 B1
(45) Date of Patent: Feb. 20, 2001

(54) MICROMECHANICAL LAYER STACK ARRANGEMENT PARTICULARLY FOR FLIP CHIP OR SIMILAR CONNECTIONS

(75) Inventors: Günter Igel, Teningen; Hans-Jürgen Gahle, Emmendingen; Mirko Lehmann, Freiburg, all of (DE)

(73) Assignee: Micronas GmbH, Freiburg (DE)

( * ) Notice: Under 35 U.S.C. 154(b), the term of this patent shall be extended for 0 days.

(21) Appl. No.: 09/506,634

(22) Filed: Feb. 18, 2000

(30) Foreign Application Priority Data

Feb. 19, 1999 (DE) .............................................. 199 07 168

(51) Int. Cl.[7] .......................... H01L 23/48; H01L 29/40; H05K 7/20; H05K 1/18
(52) U.S. Cl. .......................... 257/778; 257/737; 257/738; 257/774; 257/758; 257/700; 257/784; 257/693; 257/686; 257/687; 361/719; 361/400; 361/762; 361/790; 174/261; 174/255; 174/264; 174/250; 439/331; 439/333
(58) Field of Search .................................. 257/777–781, 257/784, 786, 772, 700, 701, 758, 737, 734, 738, 693, 735, 774, 773, 686, 687; 361/719, 705, 400, 740, 795, 763, 762, 767, 790; 174/261, 255, 266, 250; 439/331, 333

(56) References Cited

U.S. PATENT DOCUMENTS

| | | | |
|---|---|---|---|
| 5,164,818 | * 11/1992 | Blum et al. | 257/778 |
| 5,432,675 | * 7/1995 | Sorimachi et al. | 257/700 |
| 5,478,973 | * 12/1995 | Yoonet et al. | 361/760 |
| 5,854,534 | * 12/1998 | Beilin et al. | 257/700 |
| 5,872,399 | 2/1999 | Lee | 257/738 |
| 5,936,843 | * 10/1999 | Ohshima et al. | 361/760 |
| 5,955,781 | * 9/1999 | Joshi et al. | 257/758 |
| 6,034,431 | * 3/2000 | Goosen et al. | 257/784 |
| 6,037,786 | * 3/2000 | Palagonia | 324/754 |
| 6,043,563 | * 3/2000 | Eldridge et al. | 257/784 |
| 6,054,652 | * 4/2000 | Moriizumi et al. | 174/261 |
| 6,107,109 | * 8/2000 | Akram et al. | 438/15 |
| 6,117,299 | * 9/2000 | Rinne et al. | 205/125 |

FOREIGN PATENT DOCUMENTS 10189633   7/1998   (JP) .

OTHER PUBLICATIONS

John H. Lau, A Brief Introduction to Flip Chip Technologies for MCM Applications, *Flip Chip Technologies* (1996) pp. 26–27 & 196–197.

\* cited by examiner

*Primary Examiner*—Alexander O. Williams
(74) *Attorney, Agent, or Firm*—Akin, Gump, Strauss, Hauer & Feld, L.L.P.

(57) ABSTRACT

A process is provided for manufacturing a layer arrangement (1) having a bump for a flip chip or similar connection. The layer arrangement has a plurality of layers (2, 3, 4, 5, 6, 7, 11) made of solid material and stacked into a layer stack (8). A recess (10) that extends over several layers (2, 3, 4, 5, 6, 7, 11) is made in the layer stack (8) transverse to the coating planes of the layers (2, 3, 4, 5, 6, 7, 11). A bump material (14) is placed in the recess (10). A profiling is created on the lateral boundary wall of the recess (10) by removal of layer material of different layers (2, 3, 4, 5, 6, 7, 11) of the layer stack (8). The profiling, starting from the surface (9) of the layer stack (8) and progressing in layers to the inside of the recess (10), has at least two indentations (12) and at least one projection (13) located between them. After the production of the profiling, a bump material (14) is brought into the recess (10) in such a way that it grasps behind the indentations (12).

9 Claims, 2 Drawing Sheets

MICROMECHANICAL LAYER STACK ARRANGEMENT PARTICULARLY FOR FLIP CHIP OR SIMILAR CONNECTIONS

BACKGROUND OF THE INVENTION

The invention relates to a process for manufacturing a layer arrangement having at least one bump, especially for a flip chip or similar connection, wherein several layers made of solid material are stacked into a layer stack. At least one recess is made in the stack transverse to the coating planes of the layers, into which a bump material is filled or applied. In addition, the invention relates to a layer arrangement with a layer stack having several layers made of solid material and having a recess extending transverse to the coating planes of the layers. A bump is arranged in the recess, which is provided especially for a flip chip or similar connection, and has a projection projecting on the surface of the layer stack, wherein the bump is made of a continuous one-piece bump material.

A process of this type and a layer arrangement manufactured according to it are already known from the book *Flip Chip Technologies*, John H. Lau, McGraw-Hill (1996). In the process, on a portion of the surface of a substrate made of a semiconductor material, an aluminum layer functioning as a connection path is first applied in certain areas. After that, the substrate is coated with a passivation layer, which covers the aluminum layer and the surface area of the substrate adjoining it. To expose the aluminum layer, a recess is then made in the passivation layer. On the aluminum layer and areas of the passivation layer laterally adjoining it, adhesive layers are applied, which are to improve the adhesion of additional layers to be applied and the bump material to be brought into the recess. Onto the adhesive layers, a copper layer is applied, which should make it more difficult for moisture to penetrate into the layer stack, and a gold layer is applied, which functions as an oxidation barrier. Next, the bump material is brought into the recess, for example, by vacuum evaporation through a metal mask, by plating, dispersion, or imprinting.

With the adhesive layers located between the substrate and the bump material, a better adhesion of the bump to the substrate is indeed achieved to a certain extent. However, the mechanical solidity of the layer arrangement manufactured according to the process is nevertheless in need of improvement. In practice, the moisture resistance of the layer arrangement has additionally proven to be problematic, since moisture can get under the bump material and can cause corrosion on the bump material and/or the layers of the layer stack. On the one hand, the mechanical solidity of the layer arrangement is thereby weakened, and on the other hand, the moisture can also change the electrical properties of the layer arrangement. In particular, there is the danger in a bump functioning as an electrical connection contact, that the moisture will cause electrical leak currents or short circuits.

SUMMARY OF THE INVENTION

Therefore, an object of the invention is to create a layer arrangement of the type described at the outset, in which the bump adheres to the layers of the layer stack especially well. In a bump comprising an electrically conducting material, the layer arrangement should in addition make possible a small electrical resistance between the bump and the layers. In addition, an object of the invention is to provide a process for manufacturing a layer arrangement of this type.

The object is achieved in regard to the process in that a recess is made in the layer stack extending over several of its layers, and that a profiling is created on the lateral boundary wall of the recess by removing layer material of different layers of the layer stack. The profiling has at least two indentations, proceeding in layers from the surface of the layer stack adjoining the recess to the interior of the recess, and has at least one projection located between them. The bump material is brought into the recess after the manufacture of the profiling in such a way that it grasps behind the indentations.

The boundary wall of the recess is thus provided with a profile by the layer-wise removal of layer material, and the bump material is introduced into the recess in a manner such that it catches in the open spaces of the profiling or between the respective profiling projections and indentations adjacent to each other. In an advantageous manner, a form-fitting connection thereby results between the bump and the layer stack, such that lateral projections of the bump grasp behind the indentations of the boundary wall of the layer stack. The bump material thus engages in a comb-like manner into the profiling of the boundary wall formed by the layer stack. A good adhesion of the bump into the layer stack and thus a correspondingly great strength of the connection between the bump and the layer stack is thereby achieved. In an expedient way, the bump material is introduced into the recess completely, so that a continuous single-piece, mechanically-stable bump results, which is macroscopically homogeneous and free of border surfaces. When seen microscopically, the bump material can have non-homogeneities, for example if the bump material is made of an elastic plastic mass, in which metal or similar solid particles are included.

By the toothing between the layer stack and the bump material, resulting from the projections and indentations of the profiling made in the boundary wall, a good moisture resistance of the layer arrangement is additionally achieved. In particular, the danger is reduced that moisture from the surface of the layer arrangement proceeds along the surface of the boundary wall of the recess, which forms the border area between the layer stack and the bump, gets to the rear side of the bump, and causes corrosion there.

The layers of the layer arrangement can be manufactured, for example, by vapor deposition, by a chemical reaction on the surface of the layer stack, in particular by oxidation of layer material, by galvanic deposition (plating) of layer material, or other coating processes known per se from planar technology. A good mechanical connection can thereby be achieved between the respectively-neighboring, adjoining layers of the layer stack.

Since the bump material is first brought into the recess after the production of the layer arrangement, the process additionally allows a simple manufacture of the layer arrangement. In particular, the recess can be introduced in one operation into several or even all layers of the layer stack, for example by an etching process. By introducing the bump into the layer stack, an intervention into the manufacturing process of the layer stack can be avoided.

An especially advantageous embodiment of the invention provides that a liquid or flowable bump material is introduced into the recess and is then solidified, in particular by hardening, curing, and/or drying of a solvent contained in the bump material. The bump material can thereby be filled into the recess in a simple way such that, even in the area of the open spaces or recesses formed between respectively adjacent indentations and projections of the boundary wall, a complete filling and thus a good form-fitting connection of the bumps to the layer stack can be achieved. The bump material may be, for example, a casting compound which is poured into the recess. The liquid or flowable bump material can be introduced into the recess, for example, by imprinting of the layer stack, in particular using a screen printing process. The bump material can thereby be introduced simultaneously in a simple way into a plurality of recesses located in the layer stack.

Another embodiment of the invention provides that the bump material is plated onto the lateral boundary wall and/or the bottom of the recess. The bump material can then reach especially well into the area of the indentations of the boundary wall of the recess. The plating of the bump material can be done without current or using an external electrical field.

A preferred, especially advantageous embodiment of the invention provides that the layer stack is brought into contact with an etchant to create the recess. Here, the layer materials of the individual layers are selected in such a manner that they have different etching rates relative to the etchant to form the profiling in the boundary wall of the recess. Using the etchant, all layers of the layer stack can be profiled layer-wise in a simple way in one operation. In the area of an indentation to be formed between adjacent two layers, the first of the two adjacent layers, located closer to the surface of the layer stack adjacent to the recess, has a slower etching rate than the second adjacently arranged layer, spaced farther away from the surface of the layer stack. An under-etching of the first layer in the area of the second layer is thereby achieved, thus forming an indentation.

In an especially advantageous further embodiment of the invention, it is provided that at least one and preferably several electrically conducting layers are stacked into the layer stack. Here, the recess is made in the layer stack in such a way that it borders, especially in the area of a projection and/or indentation of the profiling of the boundary wall, on the electrically conducting layer(s). In order to form a connection contact, an electrically conducting bump material is filled or brought into the recess. The bump can thus be connected simultaneously to several electrically conducting layers of the layer stack, which can optionally be connected to each other. The electrical contact resistance between the electrically conducting layers and the bump is thereby considerably reduced.

Optionally, in addition to the layers of the layer stack laterally adjoining the recess, a layer stack layer forming the bottom of the recess is also made of an electrically conducting material, which allows an even smaller electrical contact resistance between the bump and the electrically conducting layers. Upon a current flow into the bump, a smaller heat development then occurs, because of the reduced ohmic transition resistance between the electrically conducting layers and the bump. The thermal stress of the circuit arrangement, which for example can have an integrated circuit and/or can be part of an electrical printed circuit board, is thereby correspondingly reduced. Optionally, the bump can also function as through-contacting, which electrically connects to each other electrically conducting layer areas, such as strip conductors or the like, arranged in one and/or in several different layers of the layer stack. The electrically conducting layers of the layer stack and/or the bump material preferably have one or more metals as main components, in particular aluminum, copper, silver, gold, tungsten, titanium, nickel and/or palladium.

In one embodiment of the invention it is provided that before, during and/or after the introduction of the liquid or flowable bump material into the recess, an electrically conducting contact pin or a contact wire, in particular, is stuck into the bump material, and the bump material is thereafter solidified. A bond connection that is simple to manufacture thereby results which, in addition to a good mechanical stability and a low electrical contact resistance, also has the advantage that it extends over only a relatively small surface area of the layer stack. In a layer arrangement constructed as a semiconductor chip, expensive chip area can thereby be saved.

It is advantageous if the recess is made in the layer stack as a pocket hole, if at least one optical emitter and/or receiver element is arranged in the bottom of the recess facing the interior of the recess, and if an optically transparent bump material is filled or brought into the recess, in particular so that the bump material has on its free end an approximately lenticular projection. A compactly designed optical emitter and/or reception device thereby results. It is even possible, here, that a plurality of recesses are introduced next to each other in the layer stack in an array shape, in which respectively at least one optical emitter and/or receiver element is arranged. In the different recesses bump materials having different colors, which can be, for example, base colors of a color system, can optionally be filled as optical color filters.

In an advantageous embodiment of the process, at least one optically transparent layer is stacked in the layer stack, and an optically transparent bump material is filled or brought into the recess. The optically transparent layer of the layer arrangement manufactured according to the process can then function as a waveguide for optical radiation coupling through the bump into and/or out of the layer stack.

With regard to the layer arrangement, the aforementioned object of the invention is achieved in that the recess extends transverse to the coating planes of the layers across several layers of the layer stack. Here, the lateral boundary wall of the recess has at least a profiling which has, proceeding in layers from the surface of the layer stack bordering the recess to the interior of the recess, at least two indentations and at least one projection located in between, and the bump grasps behind these indentations.

The bump is then connected so that it is form-fitting with the layer stack and grasps behind these layers in certain areas, such that an especially good adhesion of the bump to the layer stack is achieved. In addition, the layer arrangement has a good resistance to moisture and corrosion. In particular, by the profiling of the lateral boundary wall of the recess and the projections or indentations of this profiling running transverse to the extension direction of the bump, the path running along the boundary wall from the surface of the layer stack to the rear side of the bump or to the bottom of the recess is enlargered, so that moisture located on the surface of the layer stack can not so easily get to the rear side of the bump. In addition, the advantages mentioned for the process apply correspondingly for the layer arrangement.

In an especially advantageous embodiment of the invention, the bump is constructed as an electrical connection contact and is made of an electrically conducting material, such that the bump is connected in an electrically conducting manner to at least one layer of the layer stack, which preferably forms a projection of the profiling of the lateral boundary wall and defines the recess of the stack layer. Here, it is even possible that several layers of the layer stack are made of an electrically conducting material, which is connected in an electrically conducting manner to the bump at its edge area bordering the recess. The layer arrangement then has a particularly low ohmic resistance between the bump and the electrically conducting layers, which can optionally be connected to each other.

BRIEF DESCRIPTION OF THE SEVERAL VIEWS OF THE DRAWINGS

The foregoing summary, as well as the following detailed description of the invention, will be better understood when read in conjunction with the appended drawings. For the purpose of illustrating the invention, there are shown in the drawings embodiment(s) which are presently preferred. It should be understood, however, that the invention is not limited to the precise arrangements and instrumentalities shown. In the drawings.

DETAILED DESCRIPTION OF THE DRAWINGS

Figure 1:
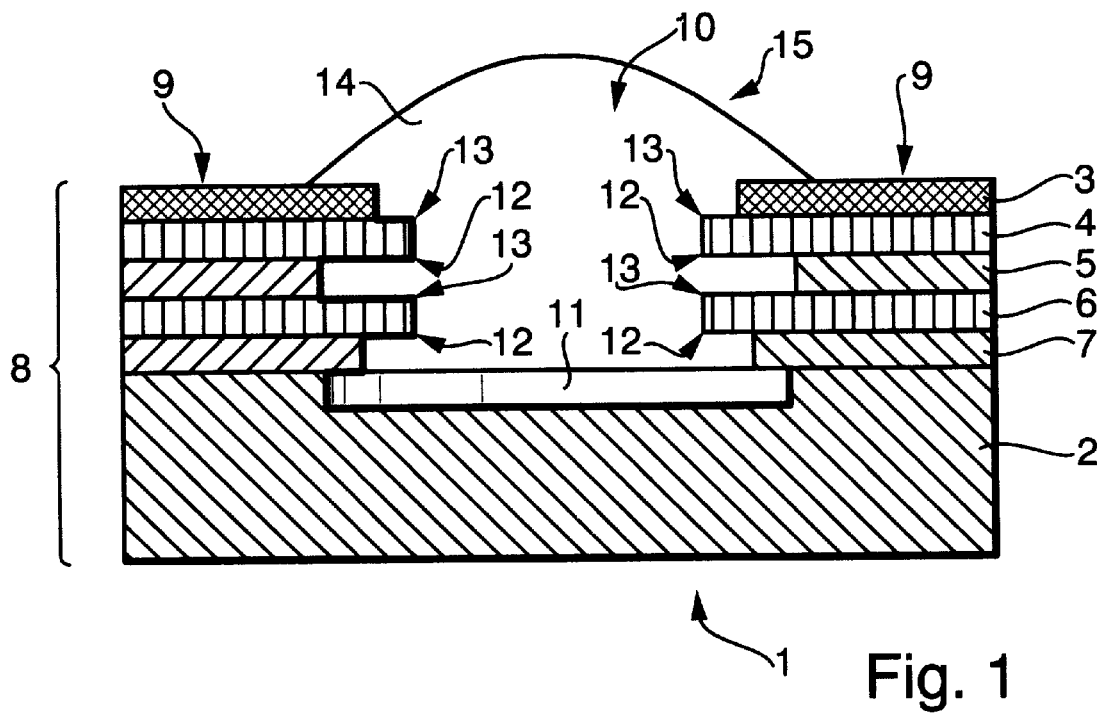
FIG. 1 is a longitudinal section through a micromechanical layer arrangement, having a recess introduced into the surface of a layer stack, in which a bump for a flip chip connection is arranged.

In a process for manufacturing a layer arrangement, indicated as a whole by 1, several layers 3, 4, 5, 6, 7 made of a solid material are stacked into a layer stack 8 on a substrate material 2, which can be made of, for example, silicon, gallium arsenide, silicon carbide, indium phosphide or a similar solid material. The individual layers 3, 4, 5, 6, 7 are applied onto the substrate material 2 in a planar manner by a process known per se from planar technology, for example by sputtering or chemical vapor deposition (CVD).

After production of the layer stack 8, a recess 10, laterally surrounded by the layers 3, 4, 5, 6, 7, is introduced using an etchant into the flat-sided surface 9 of the layer stack 8 transverse to the coating planes of the layers 3, 4, 5, 6, 7. The recess 10 penetrates through several of the layers 3, 4, 5, 6, 7 and at its lowest position borders a base layer 11, which is included in the substrate material 2. On the lateral bordering wall of the recess 10, a profiling is created by the removal of layer material from various layers 3, 4, 5, 6, 7 of the layer stack 8. Starting from the surface 9 of the layer stack 8 toward the interior of the recess 10, the profiling has, by layers, two indentations 12 and a projection 13 located between them.

After the completion of the profiling, a liquid or flowable bump material 14, which can be, for example, a polymer or a solderable metal, is filled into the recess 10, such that it grasps behind the indentations 12. Then, the bump material 14 becomes affixed. With a polymer this can be achieved by curing; with a bump material dissolved in a solvent this can be achieved by vaporization of the solvent and with a metal this can be achieved by cooling off and hardening. After attaching the bump material, a formfitting connection results between the layer stack 8 and the bump material 14, which has a high mechanical strength to prevent the bump material from detaching from the recess 10. The recess 10 is filled completely with the bump material 14 in one operation. After attaching the bump material, this material is thus a continuous single piece and is connected together with prevention of border layers.

The bump material 14 is filled into the recess 10 in such a way that it has, at least after the attachment, a projection 15 projecting approximately in the extension direction of the bump relative to the plane that spreads from the peripheral edge of the bump. In the embodiments shown in FIG. 1 to 3, the projection 15 overhangs on the surface 9 of the layer stack 8. The projection 15 can instead be completely or partially arranged in the interior of the recess 10. The thickness of the projection 14 oriented transverse to the coating plane of the layers 3, 4, 5, 6, 7 amounts to a multiple of the corresponding thickness of the individual layers 3, 4, 5, 6, 7. The projection 15 can be connected to a connection piece (not shown in the drawing), for example a chip, a printed circuit board or a micromechanical structural component, for example by adhesion or soldering.

The indentation 12 and the projection 13 are introduced in the boundary wall of the recess 10 by etching. For this purpose, adjacent and bordering layers 3, 4, 5, 6, 7 of the layer stack 8 have respectively different etching rates relative to the etchant. It is clearly recognizable in the drawing that the layers 4 and 6 have approximately the same etching rates and that the layers 3, 5 and 7 adjacent thereto have a greater etching rate than the layers 4 and 6. Accordingly, the recess 10 has a larger diameter in the area of the layers 3, 5, 7 than in the area of the layers 4 and 6.

The layers 4, 5, 6, 7 and the base layer 11 are made of an electrically conducting metallic material. The bump that engages in the recess 10 is constructed as an electrical connection contact and is likewise made of an electrically conducting material, for example of metal or a metal particle-containing polymer material. The layer 3 bordering the surface 9 of the layer stack 8 is an electrically insulating passivation layer. The layers 4, 5, 6, 7 are each connected to the lateral boundary wall of the recess 10, and the base layer 11 is connected in an electrically conducting manner to the bump material 14 at the bottom of the recess 10. In addition, the layers 4, 5, 6, 7 and 11 are connected with each other in an electrically conducting manner.

In an advantageous way, a comparatively small electrical contact resistance thereby results between the bump material 14 and the layers 4, 5, 6, 7, 11 of the layer stack 8. In the drawing it can be clearly recognized that, with the indentations 12 and the projections 13, a relatively large connection surface is present between the bump material 14 and the layer stack 8, such that the electrical resistance between the bump material and the electrically conducting layers 4, 5, 6, 7, 11 of the layer stack 8 is additionally reduced. In a corresponding manner, a good heat conductivity also results between the bump material and the layer stack 8, such that the thermal stress of the layer arrangement 1 is reduced.

Figure 2:
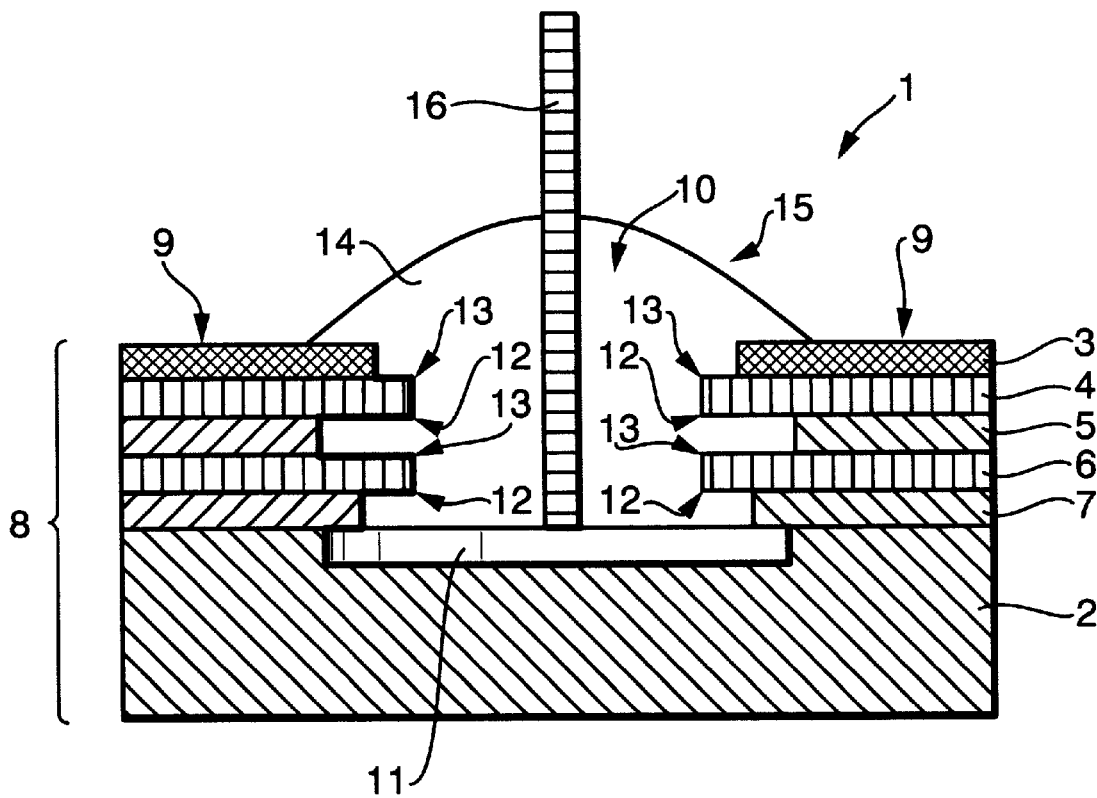
FIG. 2 is a representation similar to FIG. 1, in which however a contact pin is introduced into the bump material.
Figure 3:
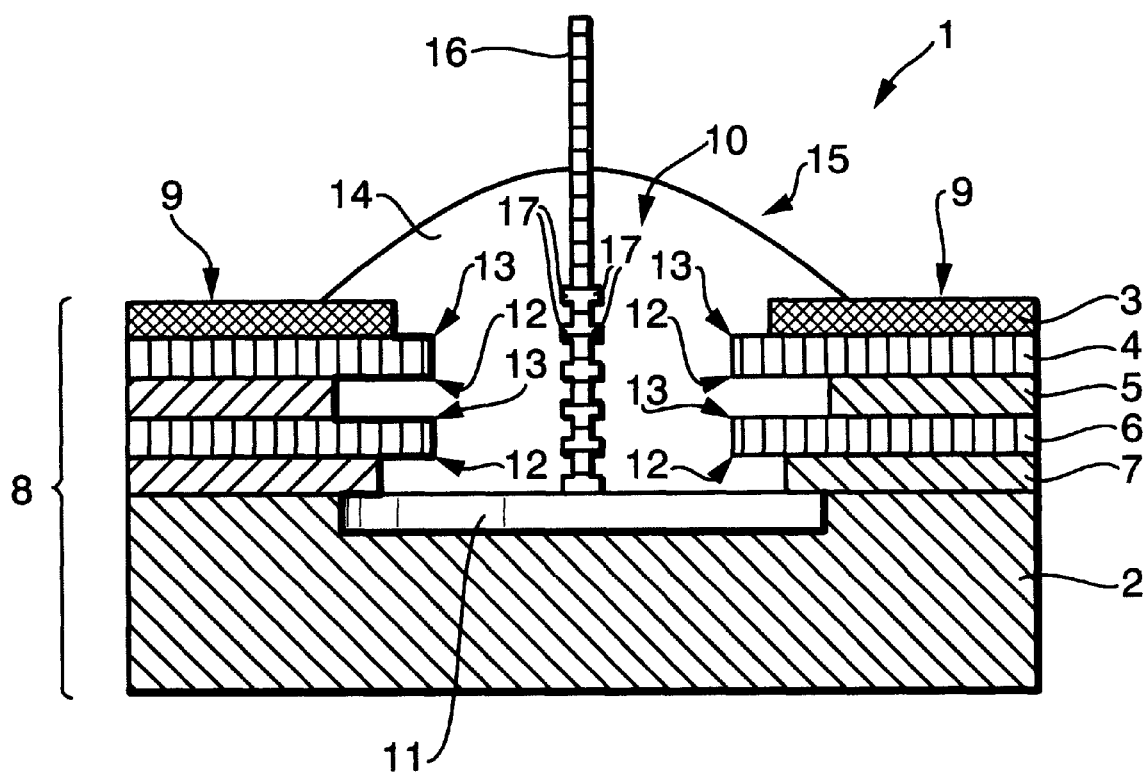
FIG. 3 is a representation similar to FIG. 2, in which however the end region of the contact pin, which engages with the bump material, is profiled.

In the embodiment according to FIG. 2, prior to the solidification of the bump material brought into the recess 10, a contact pin 16 is inserted into the bump material 14, which can be, for example, a bond wire leading to an external connection pad. From FIG. 2 it can be recognized that the contact pin 16 is arranged with its longitudinal axis transverse, in particular approximately orthogonal to the coating planes of the layers 3, 4, 5, 6, 7. The bond connection thus requires only a relatively small portion of the surface 9 of the layer stack 8. In order to anchor the contact pin 16 in the bump material 14, the contact pin 16 can have profiling projections 17 oriented transverse to its extension direction, which each grasp behind the bump material 14 in the use position (FIG. 3). The projections 17 are provided at least on a section of the contact pin 16 that engages into the bump material, but they can also be arranged in a contact pin section located outside of the bump material 14.

It should also be mentioned that the layer stack 8 can have, in particular between two electrically conducting layers 2, 3, 4, 5, 6, 7, 11, at least one electrically insulating layer, which can be made of, for example, silicon dioxide, silicon nitride or SIPOS. In the embodiment according to FIG. 1, for example, the layers 5, 7 can be insulation layers. Insulation layers of this type are advantageous especially with a CMOS component manufactured by a CMOS process, in which strip conductors, necessary for the function of the CMOS component, are manufactured by large-surface mounting of a metallization on a chip and then masking of this metallization, such that one insulation layer is arranged between respectively adjacent layers with strip conductors. The layers 3, 4, 5, 6, 7 of the layer stack 8 laterally adjacent to the recess 10 can then be manufactured with the strip conductors by masking the metallization in one operation. In an advantageous manner, the mounting of additional layers 3, 4, 5, 6, 7 for the layer stack 8 can thereby be omitted.

It will be appreciated by those skilled in the art that changes could be made to the embodiment(s) described above without departing from the broad inventive concept thereof. It is understood, therefore, that this invention is not limited to the particular embodiment(s) disclosed, but it is intended to cover modifications within the spirit and scope of the present invention as defined by the appended claims.

We claim:

1. A layer arrangement (1) comprising a layer stack (8) having a plurality of layers (2, 3, 4, 5, 6, 7, 11) made of solid material, a recess (10) extending transverse to coating planes of the layers (2, 3, 4, 5, 6, 7, 11), a bump arranged in the recess (10), the bump being made of a continuous, single-piece bump material (14), wherein the recess (10) extends across several layers (2, 3, 4, 5, 6, 7, 11) of the layer stack (8), wherein a lateral boundary wall of the recess (10) has at least one profiling that, progressing layer-wise from a surface (9) of the layer stack (8) bordering the recess (10) to an interior of the recess (10), has at least two indentations (12) and at least one projection (13) located therebetween, and wherein the bump grasps behind the indentations (12).

2. The layer arrangement according to claim 1, wherein the bump is formed by a casting compound poured into the recess (10).

3. The layer arrangement according to claim 1, wherein the bump material is plated onto the lateral boundary wall of the recess (10) and/or a bottom of the recess (10).

4. The layer arrangement according to claim 1, wherein the recess (10) having the profiling is etched into the layer stack (8).

5. The layer arrangement according to claim 1, wherein the bump is constructed as an electrical connection contact and comprises an electrically conducting material, and wherein the bump is connected in an electrically conducting manner with at least one layer (2, 3, 4, 5, 6, 7, 11) of the layer stack (8) bordering the recess (10) in an area having the indentation (12) and/or a projection (13) of the profiling of the lateral boundary wall.

6. The layer arrangement according to claim 1, further comprising an electrically conducting contact pin (16) or contact wire inserted into the bump.

7. The layer arrangement according to claim 1, wherein the bump comprises an optically transparent bump material (14) and has on its free end an approximately lenticular projection (15), wherein the recess (10) is constructed as a pocket hole, and wherein at least one optical emitter and/or receiver element is arranged in a bottom of the recess (10) facing the bump.

8. The layer arrangement according to claim 1, wherein the bump and at least one layer (2, 3, 4, 5, 6, 7, 11) of the layer stack (8) are made of an optically transparent material.

9. The layer arrangement according to claim 1, wherein the bump is provided for a flip chip or similar connection.

* * * * *